United States Patent
Kim et al.

(10) Patent No.: US 11,700,718 B2
(45) Date of Patent: Jul. 11, 2023

(54) PARTICLES FOR ABSORBING GHZ-BAND ELECTROMAGNETIC WAVE AND ELECTROMAGNETIC WAVE ABSORBER INCLUDING SAME

(71) Applicants: HYUNDAI MOTOR COMPANY, Seoul (KR); KIA MOTORS CORPORATION, Seoul (KR); KOREA NATIONAL UNIVERSITY OF TRANSPORTATION Industry-Academic Cooperation Foundation, Chungju-si (KR)

(72) Inventors: Hyung Suk Kim, Gwangmyeong-si (KR); Eun Soo Lim, Pyeongtaek-si (KR); Ji Eun Yoo, Yangju-si (KR); Young Min Kang, Chungju-si (KR)

(73) Assignees: HYUNDAI MOTOR COMPANY, Seoul (KR); KIA MOTORS CORPORATION, Seoul (KR); KOREA NATIONAL UNIVERSITY OF TRANSPORTATION INDUSTRY-ACADEMIC COOPERATION FOUNDATION, Chungju-si (KR)

( * ) Notice: Subject to any disclaimer, the term of this patent is extended or adjusted under 35 U.S.C. 154(b) by 366 days.

(21) Appl. No.: 17/098,657

(22) Filed: Nov. 16, 2020

(65) Prior Publication Data

US 2022/0071069 A1   Mar. 3, 2022

(30) Foreign Application Priority Data

Aug. 25, 2020   (KR) .................. 10-2020-0107194

(51) Int. Cl.
*H05K 9/00* (2006.01)
*C08K 3/22* (2006.01)
(Continued)

(52) U.S. Cl.
CPC ........... *H05K 9/0081* (2013.01); *C01G 51/70* (2013.01); *C08K 3/04* (2013.01); *C08K 3/22* (2013.01);
(Continued)

(58) Field of Classification Search
CPC ...... H05K 9/0081; C01G 51/70; C01G 51/66; C01G 49/0018; C01G 49/0036;
(Continued)

(56) References Cited

U.S. PATENT DOCUMENTS

| 9,338,932 | B2* | 5/2016 | Hirose | ............... C01G 49/0009 |
| 2004/0151661 | A1* | 8/2004 | Tenaud | ............... C04B 35/2633 |
| | | | | 423/594.2 |
| 2004/0251997 | A1* | 12/2004 | Morel | .................. C01G 49/009 |
| | | | | 335/302 |

FOREIGN PATENT DOCUMENTS

| KR | 10-2013-0126510 A | 11/2013 |
| KR | 10-2015-0048256 A | 5/2015 |
| KR | 10-2011343 B1 | 8/2019 |

* cited by examiner

*Primary Examiner* — Andrew J. Oyer
(74) *Attorney, Agent, or Firm* — Morgan, Lewis & Bockius LLP (57) ABSTRACT

An electromagnetic wave absorbing particle has a composition, which is represented by Formula 1 of $Sr_{1-x}R_xFe_{y-2z}M_{2z}O_a$ and contains M-type hexaferrite as a main phase. In Formula 1, R is one or more substances selected from among Ba, Ca, and La, M is one or more substances selected from among Co, Ti, and Zr, $0<x\leq0.8$, $8\leq y\leq14$, $0<z\leq1.5$, and a is equal to 19.

8 Claims, 8 Drawing Sheets

(51) Int. Cl.
*C08K 3/04* (2006.01)
*C01G 51/00* (2006.01)
*H01F 1/34* (2006.01)

(52) U.S. Cl.
CPC ...... *C01P 2002/50* (2013.01); *C01P 2002/76* (2013.01); *C08K 2003/2237* (2013.01); *C08K 2003/2265* (2013.01); *C08K 2003/2289* (2013.01); *C08K 2201/014* (2013.01); *H01F 1/348* (2013.01)

(58) Field of Classification Search
CPC .... C08K 3/04; C08K 3/22; C08K 2003/2237; C08K 2003/2265; C08K 2003/2289; C08K 2201/014; C01P 2002/50; C01P 2002/76; C01P 2002/52; C01P 2006/42; C01P 2006/40; H01F 1/348; H01Q 17/004; C01B 32/20
See application file for complete search history.

PARTICLES FOR ABSORBING GHZ-BAND ELECTROMAGNETIC WAVE AND ELECTROMAGNETIC WAVE ABSORBER INCLUDING SAME

CROSS REFERENCE TO RELATED APPLICATION

The present application claims priority to Korean Patent Application No. 10-2020-0107194, filed on Aug. 25, 2020 in the Korean Intellectual Property Office, the entire contents of which is incorporated herein for all purposes by this reference.

TECHNICAL FIELD

The present disclosure relates to a particle for absorbing electromagnetic waves in a frequency band of GHz and an electromagnetic wave absorber including the same. More particularly, the present disclosure relates to an electromagnetic wave absorbing particle capable of absorbing electromagnetic waves in a frequency band of GHz by using a magnetic lossy mechanism caused by spin oscillation and to an electromagnetic wave absorber including the same.

BACKGROUND

Vehicles include many electric components, and the electric components cause problems of electromagnetic wave interference.

Therefore, in up-to-date vehicles, vehicle parts disposed around an electric component that generates electromagnetic waves or vehicle parts that need to be protected from electromagnetic waves are made of a material capable of shielding the vehicle parts against electromagnetic waves.

The conventional technology of shielding vehicle parts against electromagnetic waves has a problem of negatively affecting other vehicle parts by reflecting the electromagnetic waves.

The present disclosure is conceived from the idea that absorbing electromagnetic waves, rather than reflecting electromagnetic waves, can protect many vehicle parts from electromagnetic waves without causing negative effects.

In addition, with increasing interest in autonomous vehicles, radio communication technologies such as 5G communications and radar technology have recently been applied to autonomous vehicles. In the technology field, the frequency band of electromagnetic waves used has increased to several to several tens of GHz.

It is therefore necessary to develop materials capable of absorbing electromagnetic waves in a frequency band of several to several tens of GHz.

Conventionally, electromagnetic wave absorption techniques using a conductive mechanism have been applied to vehicle components. Specifically, carbon-based (graphite, carbon black, carbon nanotubes, carbon fibers, etc.) particles and metal-based particles are blended with polymer resin to prepare an electromagnetic wave absorber for electromagnetic waves in a frequency band of several tens of GHz.

However, since such vehicle components absorb electromagnetic waves using a dielectric or conductive lossy mechanism, there is a limitation on an increase in absorption capacity. Moreover, since there is a possibility that reflected waves cause scattering, it is impossible to eliminate electromagnetic waves.

In addition, as absorbers using magnetic powder, electromagnetic wave absorbers using Mn—Zn-based ferrite or Ni—Zn-based ferrite have been developed. However, these absorbers are not effective in absorbing electromagnetic waves in a frequency band of several tens of GHz because they lose their permeability. That is, the permeability of the conventional absorbers with respect to GHz-band electromagnetic waves is reduced to about a relative permeability measured in vacuum.

The foregoing is intended merely to aid in the understanding of the background of the present disclosure, and is not intended to mean that the present disclosure falls within the purview of the related art that is already known to those skilled in the art.

SUMMARY

The present disclosure has been made in view of the problems occurring in the related art, and one objective of the present disclosure is to provide an electromagnetic wave absorbing particle capable of absorbing GHz-band electromagnetic waves using a magnetic lossy mechanism caused by spin vibration and an electromagnetic wave absorber including the particle.

According to one embodiment of the present disclosure, an electromagnetic wave absorbing particle for absorbing GHz-band electromagnetic waves has a composition represented by Formula 1 and contains M-type hexaferrite as a main phase, $$Sr_{1-x}R_xFe_{y-2z}M_{2z}O_a$$ [Formula 1]

where R is one or more substances selected from among Ba, Ca, and La; M is one or more substances selected from among Co, Ti, and Zr; $0<x\leq0.8$; $8\leq y\leq14$; $0<z\leq1.5$; and a is equal to 19.

The electromagnetic wave absorbing particle has a composition represented by Formula 2, $$Sr_{1-x}R_xFe_{y-2z}Co_zTi_zO_{19}$$ [Formula 2]

where R is one or more substances selected from among Ba, Ca, and La; $0<x\leq0.8$; $8\leq y\leq14$; and $0<z\leq1.5$.

The electromagnetic wave absorbing particle may absorb electromagnetic waves in a frequency band of 8 to 15 GHz when Z has a value of 1.2.

In the composition of the electromagnetic wave absorbing particle, x may have a value of 0.094 to 0.15.

According to one embodiment of the present disclosure, an electromagnetic wave absorber comprises: a polymer resin; and an electromagnetic wave absorbing particle for absorbing GHz-band electromagnetic waves. The electromagnetic wave absorbing particle has a composition represented by Formula 1 and contains M-type hexaferrite as a main phase,

$$Sr_{1-x}R_xFe_{y-2z}M_{2z}O_a$$ [Formula 1]

where R is one or more substances selected from among Ba, Ca, and La; M is one or more substances selected from among Co, Ti, and Zr; $0<x\leq0.8$; $8\leq y\leq14$; $0<z\leq1.5$; and a is equal to 19.

The electromagnetic wave absorbing particle has a composition represented by Formula 2, $$Sr_{1-x}R_xFe_{y-2z}Co_zTi_zO_{19}$$ [Formula 2]

where R is one or more substances selected from among Ba, Ca, and La; $0<x\leq0.8$; $8\leq y\leq14$; and $0<z\leq1.5$.

The electromagnetic wave absorber may further include a permittivity modifier.

The permittivity modifier may be graphite.

The permittivity modifier may be contained in a ratio of 5% by weight with respect to 100% by weight of the electromagnetic wave absorbing particle.

The electromagnetic wave absorber may absorb electromagnetic waves in a frequency band of 24 GHz.

According to the embodiment of the present disclosure, M-type hexaferrite is used as absorbing particles. Due to high ferromagnetic resonance in a GHz frequency band, which is attributable to high crystal magnetic anisotropy of the M-type hexaferrite, it is possible to absorb electromagnetic waves in several tens of GHz frequency bands by using a magnetic lossy mechanism (increase in imaginary part of permeability) attributable to spin oscillation.

In addition, it is possible to expect an effect of absorbing electromagnetic waves in a desired frequency band by adding a permittivity modifier to an absorber containing electromagnetic wave absorbing particles in which M-type hexaferrite is formed as a main phase.

BRIEF DESCRIPTION OF THE DRAWINGS

The above and other objectives, features, and other advantages of the present disclosure will be more clearly understood from the following detailed description taken in conjunction with the accompanying drawings, in which.

DETAILED DESCRIPTION

Hereinafter, exemplary embodiments of the present disclosure will be described in detail with reference to the accompanying drawings. The present disclosure may, however, be embodied in many different forms and should not be construed as being limited to the embodiments set forth herein. Rather, these embodiments are provided so that the present disclosure will be thorough and complete and will fully convey the concept of the disclosure to those skilled in the art.

According to one embodiment of the present disclosure, an electromagnetic wave absorber for absorbing GHz-band electromagnetic waves is prepared by blending absorbing particles in which M-type hexaferrite is formed as a main phase with polymer resin.

In addition, the electromagnetic wave absorber may further include a permittivity modifier capable of adjusting the permittivity.

The absorbing particles have a composition represented by Formula 1.

[Formula 1]

where R is one or more substances selected from among Ba, Ca, and La; M is one or more substances selected from among Co, Ti, and Zr; 0<x≤0.8; 8≤y≤14; 0<z≤1.5; and a is equal to 19.

In this case, R essentially includes one or more substances selected from among Ba, Ca, and La and optionally includes a rare earth element as a substitute for Sr.

M is a potential metal that can replace Fe, the value of y-2z represents the content of Fe that maintains the hexagonal close-packed state as a main phase and is in a range of 8≤y≤14, and z is in a range of 0<z≤1.5.

The value of "a", which is the content of oxygen, is an important factor in maintaining the hexagonal close-packed state, and it is preferable that "a" maintains a value of about 19.

On the other hand, the absorbing particle is denoted by M and is selected from among Co and Ti. The composition of the absorbing particle is represented by Formula 2.

[Formula 2]

With this composition, it is possible to absorb electromagnetic waves in the desired frequency band among several to several tens of GHz bands which is considered to be high frequency. For instance, radio frequencies in the range between 3 and 30 gigahertz (GHz) is known as Super High Frequency (SHF), and such a band is known as centimeter band or centimeter wave. Radio frequencies in an electromagnetic spectrum from 30 to 300 gagahertz (GHz) is considered to be Extremely High Frequency (EHF), and such a band is known as millimetre band or millimetre waves.

Next, a process of deriving Formula 1 will be described.

First, the magnetic resonance frequency corresponding to the frequency at which the absorption rate is maximum is obtained according to Snoek's law.

$$(\mu_s - 1)fr = \frac{2}{3}\gamma \times 4\pi M_s \quad \text{[Snoek's law]}$$

Here, $\mu_s$: magnetic permeability $\gamma$ gyromagnetic ratio, $M_s$: saturation magnetization, and fr: means the magnetic resonance frequency.

Since the magnetic rotation ratio of a material is a constant depending on the nature of the material, the magnetic resonance frequency fr is determined depending on a saturation value $M_s$ and the value of $(\mu_s-1)$.

Therefore, in Formula 1, the value of x is fixed to 0.094, the value of y is fixed to 11, and the values of $M_s$ and $\mu_s$ are measured from a BH curve while varying the value of z.

In addition, the magnetic resonance frequency fr at which the electromagnetic wave absorption rate of each sample is maximized is obtained by using the Snoek's law. The results are shown in Table 1.

TABLE 1

| Classification (No.) | z | $\mu_s - 1$ | fr | $(\mu_s - 1)$ fr | $M_s$ | $(\mu_s - 1)$fr/$M_s$ |
|---|---|---|---|---|---|---|
| 1 | 0 | 0.242 | 14.56 | 3.52352 | 2000 | 0.00176176 |
| 2 | 0 | 0.036 | >50 | 3.06 | 2000 | 0.00153 |
| 3 | 0.8 | 0.076 | 40 | 3.04 | 1660 | 0.00183133 |
| 4 | 1 | 0.154 | 20 | 3.08 | 1630 | 0.00188957 |
| 5 | 1.2 | 0.298 | 10.1 | 3.0098 | 1630 | 0.0018465 |
| 6 | 1.4 | Slope | 3.2 | — | — | — |

In Table 1, when the value of z is in a range of 0<z≤1.5, it is confirmed that the calculated value of fr (magnetic resonance frequency) is in a range of several to several tens of GHz.

For example, in order for the value of a magnetic resonance frequency fr to be 24 GHz, the value of ($\mu_s$–1) is the closest when z=1. When theoretically calculating the value of ($\mu_s$–1) that results in the value of fr being 24 GHz using Snoek's law, the value of ($\mu_s$–1) is 0.128

Several samples having the composition described above were prepared. In the samples, z was fixed to a value of 1 and the contents of Sr and La are varied. Tests were performed on the samples to find a sample that exhibits about 0.128 as the value of ($\mu_s$–1), and the results of the tests are shown in FIG. 1.

Figure 1:
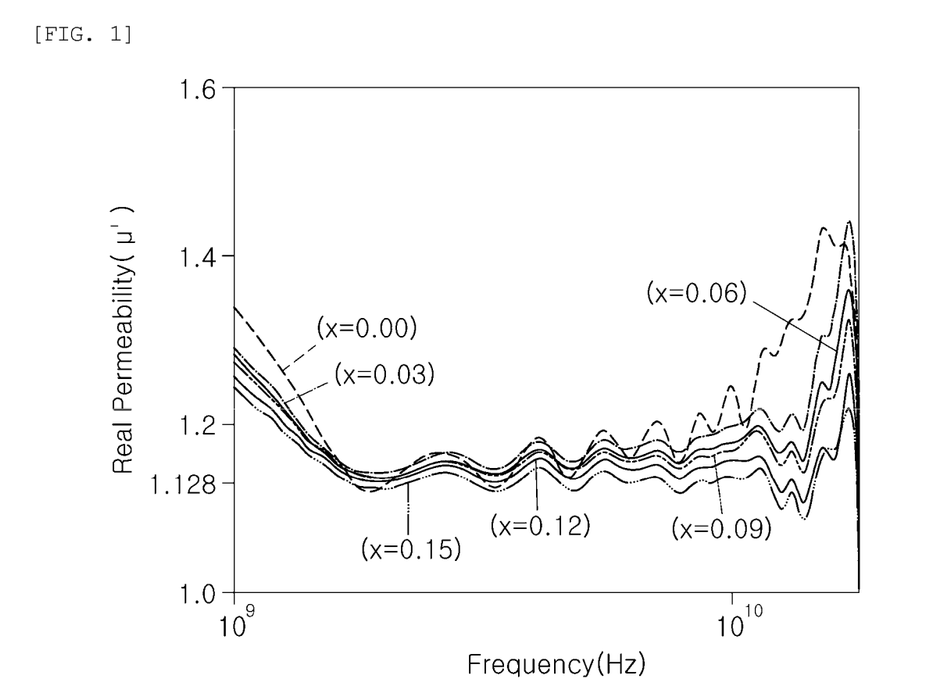
FIG. 1 is a graph illustrating a change in permeability according to the content of each of Sr and La in a composition represented by Formula 1.

As can be seen from FIG. 1, the value of $\mu_s$ decreases stepwise when the content of La increases. It was confirmed that when x=0.15, the theoretical value of ($\mu_s$–1) is 0.128 which produces 24 GHz as the value of the magnetic resonance frequency fr. That is, when x=0.15, the theoretical value of $\mu_s$ becomes 1.128. In this case, $\mu_s$ refers to the real part of the value of the magnetic permeability within a zone in which the real part of the value of the magnetic permeability almost does not change with the frequency.

Therefore, it was confirmed that an absorption effect based on the ferromagnetic resonance at a frequency of 24 GHz was obtained with electromagnetic wave absorbing particles having a composition of $Sr_{0.85}La_{0.15}Fe_9Co_{1.0}Ti_{1.0}O_{19}$.

Based on this observation, when x is 0.094 and Z is 1.2, the electromagnetic wave absorbing particles exhibit the highest absorption performance for electromagnetic waves in a frequency band of 8 to 15 GHz.

In addition, when x is 0.094 and z is 1, the electromagnetic wave absorbing particles exhibit the highest absorption performance for electromagnetic waves in a frequency band of 7 GHz.

Next, the permittivity of an electromagnetic wave absorber was controlled for impedance matching of the electromagnetic wave absorber in which the electromagnetic wave absorbing particles and the polymer resin are mixed.

In the present embodiment, graphite was added to the electromagnetic wave absorber as a permittivity modifier to control the permittivity of the absorber.

The absorbers were prepared with particles having a composition of $Sr_{0.85}La_{0.15}Fe_9Co_{1.0}Ti_{1.0}O_{19}$, and the permeability and permittivity of each of the absorbers that differ in the content of graphite were measured.

Figure 2A:
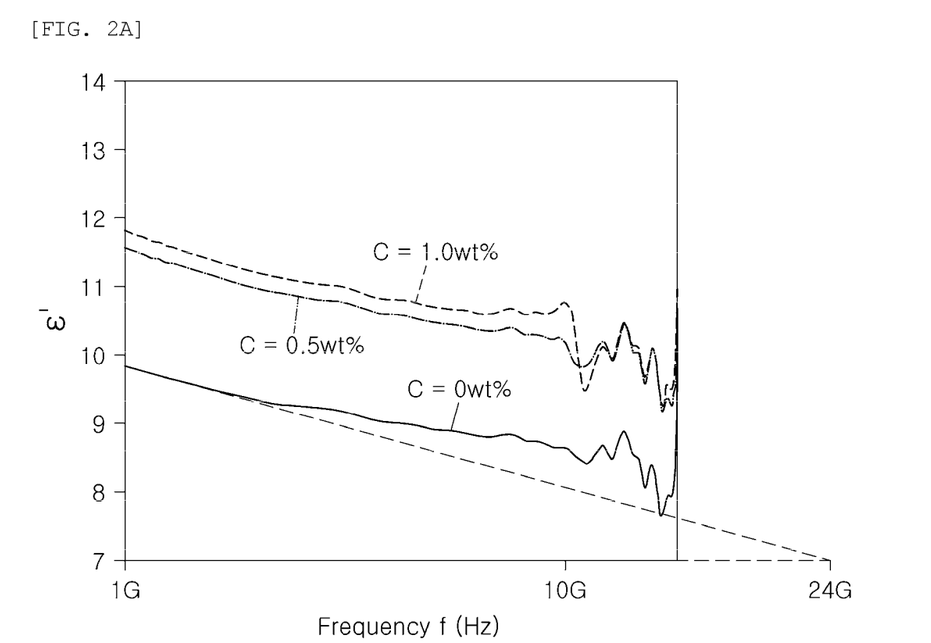
FIG. 2A is a graph illustrating a change in the real part of the value of the magnetic permeability according to the content of graphite.
Figure 2B:
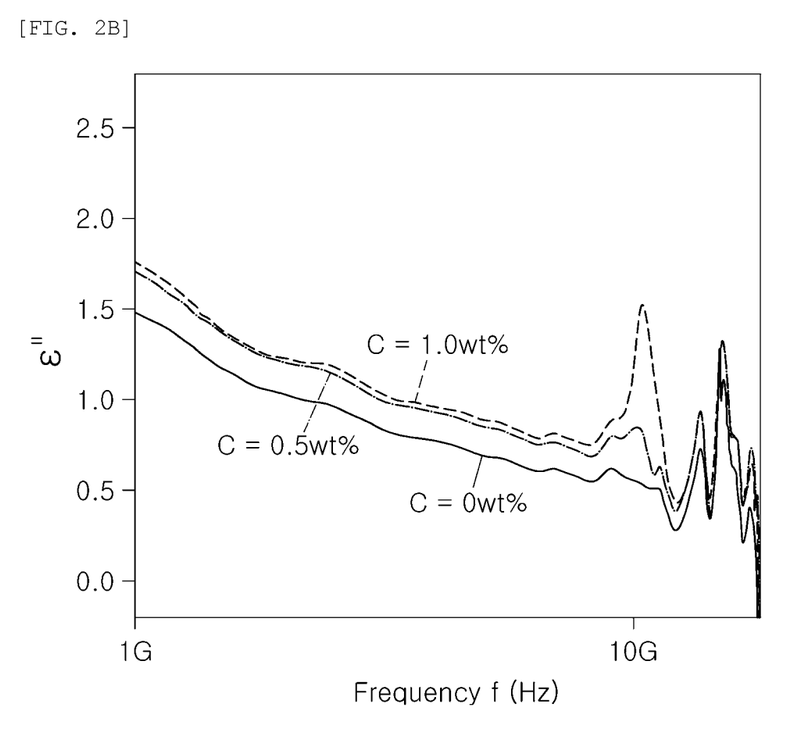
FIG. 2B is a graph illustrating a change in the imaginary part of the value of the magnetic permeability according to the content of graphite.
Figure 2C:
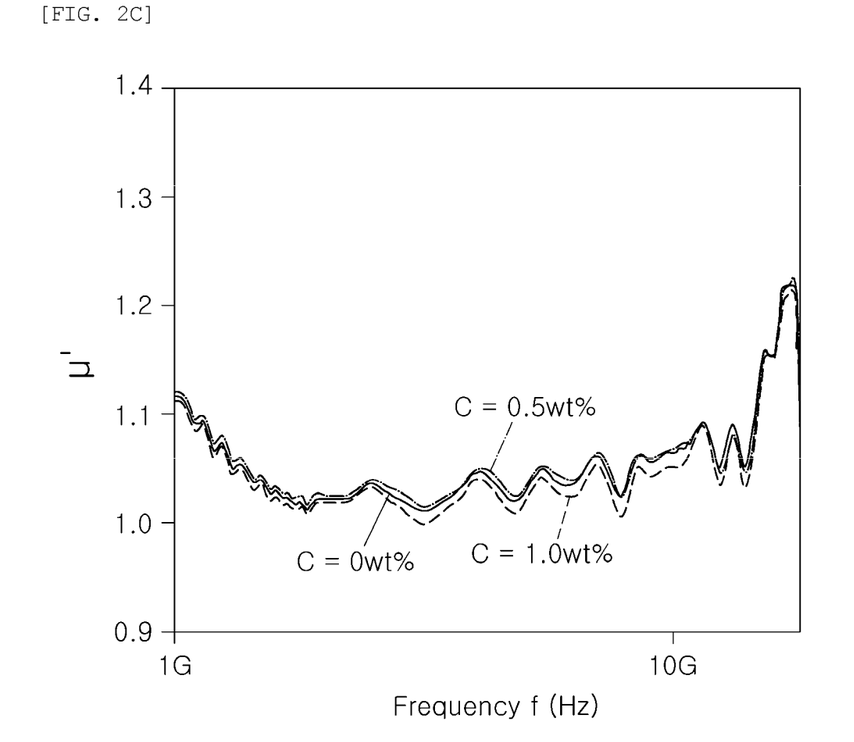
FIG. 2C is a graph illustrating a change in the real art of the value of the magnetic permeability according to the content of graphite.
Figure 2D:
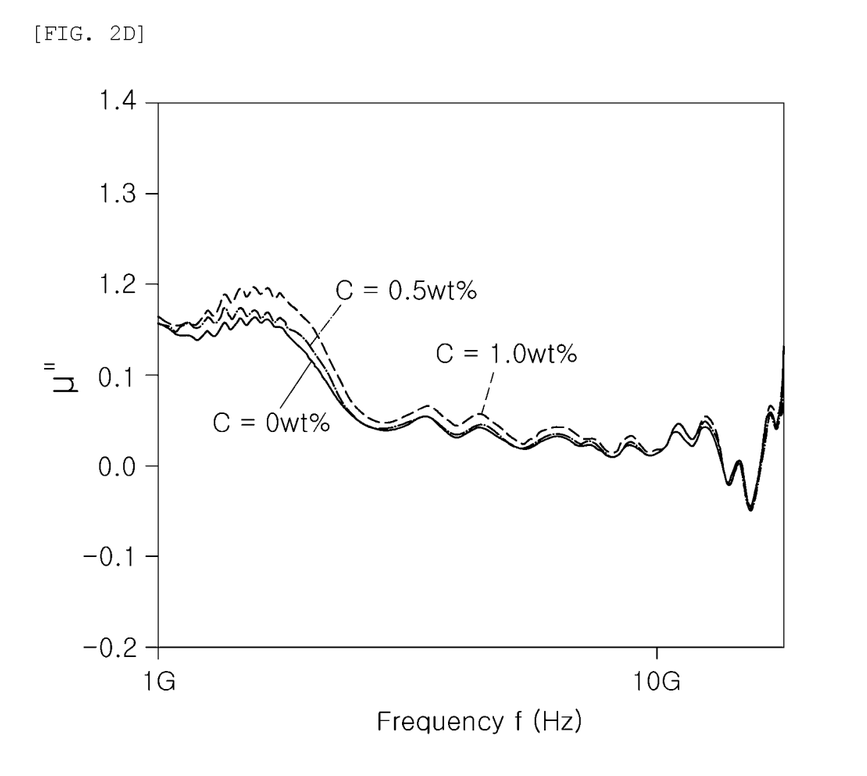
FIG. 2D is a graph illustrating a change in the imaginary part of the value of the magnetic permeability according to the content of graphite.

FIG. 2A is a graph showing a change in the real part of the value of the permittivity according to the mixing ratio of graphite, FIG. 2B is a graph showing a change in the imaginary part of the value of the permittivity according to the mixing ratio of graphite, FIG. 2C is a graph showing a change in the real part of the value of the permeability according to the mixing ratio of graphite, and FIG. 2D is a graph showing a change in the imaginary part of the value of the permeability according to the mixing ratio of graphite.

As can be seen from FIGS. 2A to 2D, when the mixing ratio of graphite varies, the magnetic permeability were pretty steady but the permittivity changed.

In particular, it can be inferred from FIG. 2A that a point at which ε'=7.0 and a point at which ε"=0.2 to 0.5 are matched with a point at which the frequency is 24 GHz.

Therefore, it was confirmed that when an appropriate amount of graphite is added to the absorber, the permittivity of the absorber can be adjusted without a change in the permeability of the absorber.

On the other hand, it is noted that the fact that the magnetic resonance frequency fr of the absorbing particles is identical to the frequency of electromagnetic waves does not guarantee that the absorbing particles can absorb electromagnetic waves well at the magnetic resonance frequency fr. To this end, it is necessary to match the impedance in the vacuum with the impedance of the absorber.

The impedance $Z_o$ in the vacuum and the impedance $Z_{in}$ of the absorbing particles can be calculated by the following relational expression.

$$Z_{in}/Z_0 = \sqrt{\mu_r/\varepsilon_r} \tanh\left[j(2\pi fd/c)\sqrt{\mu_r \varepsilon_r}\right]$$ [Relational Expression]

Therefore, in order to match the impedance $Z_o$ in the vacuum with the impedance $Z_{in}$ of the absorbing particles, the value of $Z_{in}/Z_o$ needs to be regulated to be about 1. In this way, it is possible to obtain an electromagnetic wave absorber exhibiting the highest absorption rate for electromagnetic waves in the desired frequency band.

It can be inferred from the above relational expression that the value of $Z_{in}/Z_o$ changes with the permittivity under the condition in which the magnetic permeability is not changed.

Therefore, when graphite is used as a permittivity modifier as described above, the permittivity of the absorber can be changed without a change in magnetic permeability of the absorber. Thus, it is inferred that when graphite is added to the absorber to the extent that the value of $Z_{in}/Z_o$ become about a value of 1, the magnetic resonance frequency fr of the absorber in the desired frequency band can be matched with the absorption rate.

Next, the permittivity and reflection loss of each of the absorbers that differ in the content of graphite added as a permittivity modifier thereto were measured.

The absorbers were prepared with particles having a composition of $Sr_{0.906}La_{0.094}Fe_9Co_{1.0}Ti_{1.0}O_{19}$. The permeability and permittivity of each of the absorbers were measured while varying the content of graphite.

Figure 3A:
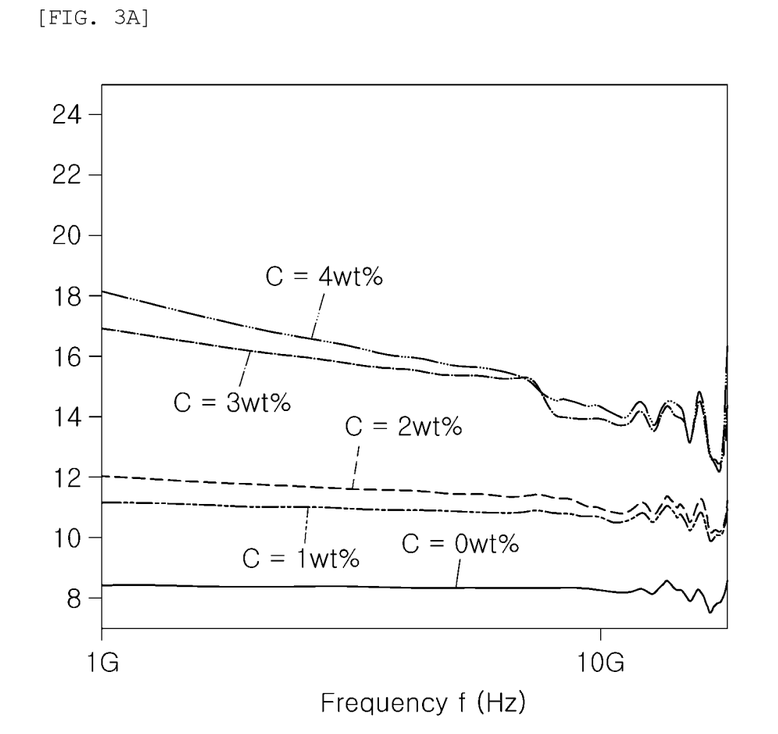
FIG. 3A is a graph illustrating a change in the real part of the value of the permittivity according to the content of graphite.
Figure 3B:
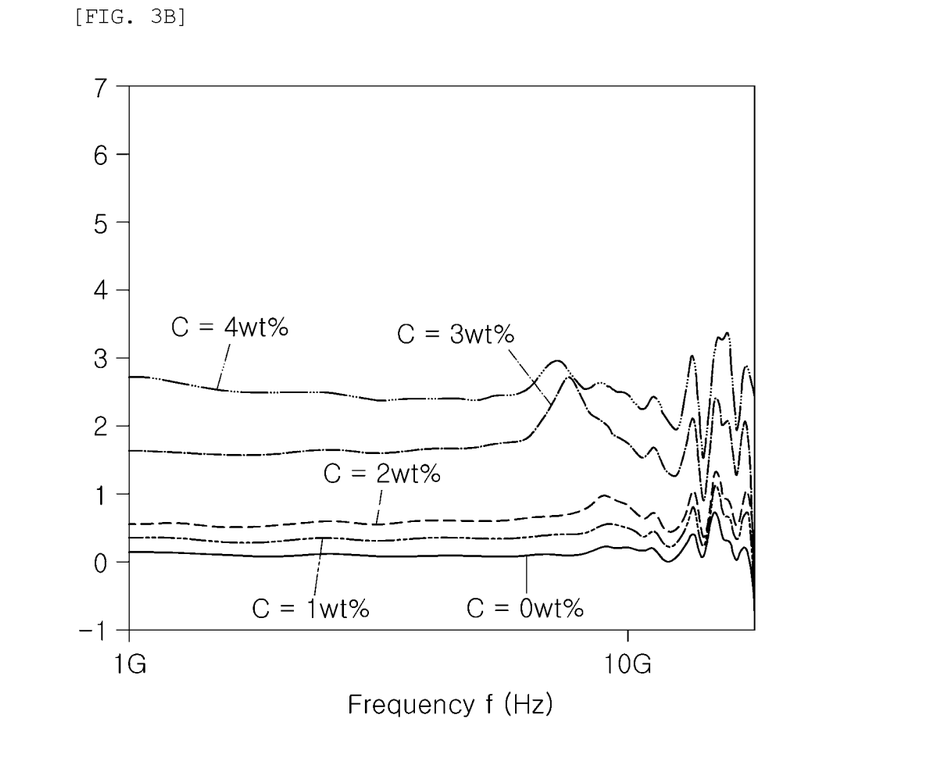
FIG. 3B is a graph illustrating a change in the imaginary part of the value of the permittivity according to the content of graphite.
Figure 3C:
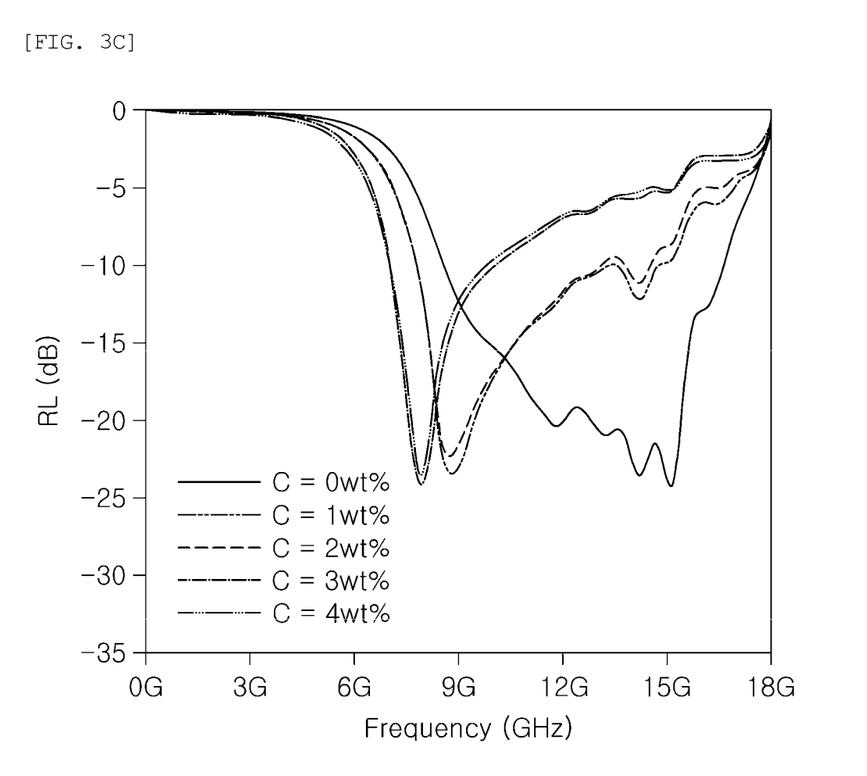
FIG. 3C is a graph illustrating a change in value of a reflection loss according to the content of graphite.

FIG. 3A is a graph showing a change in the real part of the value of the permittivity according to the mixing ratio of graphite, FIG. 3B is a graph showing a change in the imaginary part of the value of the permittivity according to the mixing ratio of graphite, and FIG. 3C is a graph showing a change in reflection loss according to the mixing ratio of graphite.

As can be seen from FIGS. 3A to 3C, when the mixing ratio of graphite changed, the permittivity changed.

As can be seen from FIG. 3C, it is possible to obtain an absorber having a maximum absorption rate for electromagnetic waves in a frequency band of 8 GHz, a frequency band of 9 GHz, and a frequency band of 15 GHz according to a change in the content of graphite in the absorber.

When graphite is added as a permittivity modifier at a mixing ratio of 5% by weight or less with respect to 100% by weight of the electromagnetic wave absorbing particles, the electromagnetic wave absorbing particles can effectively absorb electromagnetic waves in a frequency band of several to several tens of GHz.

Although the present disclosure has been described with reference to the accompanying drawings and the preferred embodiments described above, the present disclosure is not limited thereto and is defined by the appended claims. Thus, those skilled in the art can diversely modify and change the present disclosure without departing from the technical spirit of the appended claims.

What is claimed is:

1. An electromagnetic wave absorbing particle for a GHz frequency band, the electromagnetic wave absorbing particle having a composition represented by Formula 1 and having an M-type hexaferrite as a major phase, $$Sr_{1-x}R_xFe_{y-2z}M_{2z}O_a \quad \text{[Formula 1]}$$

where R is one or more substances selected from among Ba, Ca, and La,

M is one or more substances selected from among Co, Ti and Zr, $0<x\leq0.8$, $8\leq y\leq14$, $0<z\leq1.5$, and $a=19$, wherein the electromagnetic wave absorbing particle has a composition represented by Formula 2, $$Sr_{1-x}R_xFe_{y-2z}Co_zTi_zO_{19} \quad \text{[Formula 2]}$$

where R is one or more substances selected from among Ba, Ca, and La, $0<x\leq0.8$, $8\leq y\leq14$, and $0<z\leq1.5$.

2. The electromagnetic wave absorbing particle according to claim 1, wherein, when Z has a value of 1.2, the electromagnetic wave absorbing particle absorbs electromagnetic waves in an 8 to 15 GHz frequency band.

3. The electromagnetic wave absorbing particle according to claim 2, wherein x has a value of 0.094 to 0.15.

4. An electromagnetic wave absorber for a GHz frequency band, the electromagnetic wave absorber comprising:

a polymer resin; and an electromagnetic wave absorbing particle having a composition represented by Formula and having an M-type hexaferrite as a major phase, $$Sr_{1-x}R_xFe_{y-2z}M_{2z}O_a \quad \text{[Formula 1]}$$

where R is one or more substances selected from among Ba, Ca, and La,

M is one or more substances selected from among Co, Ti and Zr, $0<x\leq0.8$, $8\leq y\leq14$, $0<z\leq1.5$, and $a=19$, wherein the electromagnetic wave absorbing particle has a composition represented by Formula 2, $$Sr_{1-x}R_xFe_{y-2z}Co_zTi_zO_{19} \quad \text{[Formula 2]}$$

where R is one or more substances selected from among Ba, Ca, and La, $0<x\leq0.8$, $8\leq y\leq14$, and $0<z\leq1.5$.

5. The electromagnetic wave absorber according to claim 4, further comprising a permittivity adjusting agent.

6. The electromagnetic wave absorber according to claim 5, wherein the permittivity adjusting agent is graphite.

7. The electromagnetic wave absorber according to claim 6, wherein the permittivity adjusting agent is contained at a ratio of 5% by weight with respect to 100% by weight of the electromagnetic wave absorbing particle.

8. The electromagnetic wave absorber according to claim 7, wherein the absorber absorbs electromagnetic waves in a frequency band of 24 GHz.

* * * * *